(12) United States Patent
Lee et al.

(10) Patent No.: US 6,794,815 B2
(45) Date of Patent: Sep. 21, 2004

(54) ORGANIC ELECTROLUMINESCENT DISPLAY DEVICE, SUBSTRATE OF THE SAME AND METHOD OF CUTTING THE SUBSTRATE

(75) Inventors: Ju-won Lee, Yangsan (KR); Cheol-sig Son, Busan (KR); Sang-ho Lee, Yangsan (KR); Akihiro Yano, Kanagawa (JP); Taizou Tanaka, Kanagawa (JP); Atsushi Kota, Kanagawa (JP); Hideki Ito, Kanagawa (JP)

(73) Assignee: Samsung Oled Co., Ltd., Ulsan-si (KR)

( * ) Notice: Subject to any disclaimer, the term of this patent is extended or adjusted under 35 U.S.C. 154(b) by 0 days.

(21) Appl. No.: 10/352,008

(22) Filed: Jan. 28, 2003

(65) Prior Publication Data

US 2003/0146694 A1 Aug. 7, 2003

(30) Foreign Application Priority Data

Feb. 7, 2002 (KR) .......................................... 2002-7015

(51) Int. Cl.$^7$ ................................................ H01J 1/62
(52) U.S. Cl. ...................... 313/504; 313/505; 313/506; 313/512
(58) Field of Search ................................. 313/498, 504, 313/505, 506, 512

(56) References Cited

U.S. PATENT DOCUMENTS

| | | |
|---|---|---|
| 6,390,874 B2 | 5/2002 | Mizutani et al. |
| 6,452,576 B1 | 9/2002 | Van Velzen et al. |
| 6,677,620 B2 * | 1/2004 | Ishii et al. .................. 313/505 |

* cited by examiner

*Primary Examiner*—Vip Patel
(74) *Attorney, Agent, or Firm*—Staas & Halsey LLP

(57) ABSTRACT

An organic electroluminescent display (EL) device includes a substrate, an organic light emitting portion formed such that a positive electrode formed in a predetermined pattern, an organic layer formed on the positive electrode, and a negative electrode having a predetermined pattern in a direction orthogonal with the positive electrode are sequentially stacked, an encapsulation cap which encapsulates the organic light emitting portion, first and second groups of electrodes which are drawn out from at least one edge of the encapsulation cap and connected to the positive and negative electrodes to drive the organic light emitting portion, and first and second dummy electrodes formed at one side of the substrate.

19 Claims, 10 Drawing Sheets

ORGANIC ELECTROLUMINESCENT DISPLAY DEVICE, SUBSTRATE OF THE SAME AND METHOD OF CUTTING THE SUBSTRATE

CROSS-REFERENCE TO RELATED APPLICATIONS

This application claims the benefit of Korean Patent Application No. 2002-7015 filed on Feb. 7, 2002, in the Korean Intellectual Property Office, the disclosure of which is incorporated herein by reference.

BACKGROUND OF THE INVENTION

1. Field of the Invention

The present invention relates to an organic electroluminescent (EL) display device, and more particularly, to an organic electroluminescent display device having improved manufacturability, a substrate of the same and a method of cutting the substrate.

2. Description of the Related Art

Recently, much attention has been paid to electroluminescent display devices as spontaneous emission display devices because they have advantageous features suitable for next generation display devices, such as a wide viewing angle, a high contrast ratio and a high response speed. Electroluminescent display devices are classified into inorganic electroluminescent display devices and organic electroluminescent display devices according to materials to form emitter layers. Organic electroluminescent display devices have good luminance and a high response speed and are capable of achieving full-color display.

Generally, an organic electroluminescent display device (to be abbreviated as an organic EL device, hereinafter) is configured such that a positive electrode layer with a predetermined pattern is formed on a glass or other transparent substrate. Then, organic layers and a negative electrode layer with a predetermined pattern are sequentially stacked on the positive electrode layer in a direction orthogonal to the positive electrode layer. Here, the organic layers have a layered structure of a hole transport layer, a light emitting layer and an electron transport layer that are sequentially stacked, and these layers are made from organic compounds.

Usable materials for the organic layers include copper phthalocyanine (CuPc), N,N'-di(naphthalene-1-yl)-N,N'-diphenyl-benzidine (NPB) and tris-8-hydroxyquinoline aluminum (Alq3).

In the above-described organic EL device, where a drive voltage is applied to the positive electrode and the negative electrode, holes from the positive electrode migrate to the light emitting layer via the hole transport layer, and electrons from the negative electrode migrate to the light emitting layer via the electron transport layer. The holes and the electrons are recombined in the light emitting layer to generate excitons. As the excitons are deactivated to a ground state, fluorescent molecules of the light emitting layer emit light, thereby forming an image. U.S. Pat. Nos. 6,452,576 and 6,390,874 disclose such organic EL devices.

To mass produce organic EL devices, as shown in FIG. 1, a plurality organic light emitting portions (not shown) are formed on a large base panel 12 at a predetermined interval. The respective organic light emitting portions are encapsulated by encapsulation caps 13, and first and second groups of electrodes 14 and 15 drawn out from at least one of each end of the respective encapsulation caps 13 are patterned, thereby manufacturing a substrate 10 having the organic EL devices. The manufactured substrate 10 is cut at portions between neighboring encapsulation caps 13, thereby producing a plurality of individualized organic EL devices 11.

FIG. 2 shows a detailed diagram of the substrate 10 shown in FIG. 1. As shown in FIG. 2, the first and second groups of electrodes 14 and 15 are drawn from one edge of each of the encapsulation caps 13 which encapsulate the respective organic light emitting portions. The first and second groups of electrodes 14 and 15 apply voltages to positive and negative electrodes (not shown) which constitute the organic light emitting portions. A wide dead space 16 is provided between an end portion of electrode terminals of the first and second groups of electrodes 14 and 15 and an edge of an adjacent encapsulation cap 13, to then be easily cut along a cutting line A1. Additionally, the substrate 10 is cut along another cutting line A2. Thus, the substrate 10 is partitioned into the plurality of organic EL devices 11. To remove the dead space 16, the partitioned organic EL devices 11 may be further cut along a cutting line B, which lowers working efficiency, resulting in poor manufacturability.

Patterns of the respective electrode terminals of the first and second groups of electrodes 14 and 15 and the positive and negative electrodes connected thereto are inspected whether they are short-circuited or disconnected. In the substrate 10 of the organic EL device shown in FIG. 2, the respective organic EL devices obtained by primary cutting are individually inspected. However, individually inspecting the respective organic EL devices lowers working efficiency, resulting in poor manufacturability and requiring an increased work force and inspection facility.

FIG. 3 shows another example of a substrate 30 of an organic EL device to illustrate an inspection operation performed in terms of a unit substrate. First and second groups of electrodes 34 and 35 are drawn from respective one-side edges of encapsulation caps 33 which encapsulate a plurality of organic light emitting layers (not shown) provided on a single base panel 32 at a predetermined interval.

A wide dead space area 37 is provided between end portions of electrode terminals of the first and second groups of electrodes 34 and 35 and an edge of an adjacent encapsulation cap 33, to then be cut along a cutting line C1. Also, a common electrode 36a is formed at an end portion of electrode terminals of the first group of electrodes 34. The respective electrode terminals are all electrically connected by the common electrode 36a. A common electrode 36b is also provided at an end portion of electrode terminals of the second group of electrodes 35. After the organic EL devices are inspected through the common electrodes 36a and 36b, the substrate 30 is cut along cutting lines C1 and C2. To eliminate the electrically connected state and remove the dead space area 37, the substrate 30 is further cut along a cutting line D in parallel with the common electrodes 36a and 36b, thereby finally producing the individualized organic EL devices 31. However, similar to the substrate 10 of FIG. 2, the substrate 30 also requires an additional cutting operation to be partitioned into the plurality of organic EL devices 31, which lowers a working efficiency and results in poor manufacturability.

SUMMARY OF THE INVENTION

Accordingly, it is an aspect of the present invention to provide an organic EL device having first and second groups of electrodes which minimize inspection and cutting operations thereof, a substrate of the organic EL device and a cutting method of the substrate. Therefore, the present organic EL device increases the manufacturability thereof.

Additional aspects and advantages of the invention will be set forth in part in the description which follows and, in part, will be obvious from the description, or may be learned by practice of the invention.

To achieve the above and/or other aspects of the present invention, there is provided an organic EL device comprising a substrate, an organic light emitting portion which includes a positive electrode formed in a predetermined pattern, an organic layer formed on the positive electrode, and a negative electrode having a predetermined pattern in a direction orthogonal with the positive electrode, an encapsulation cap which encapsulates the organic light emitting portion, first and second groups of electrodes which are drawn out from at least one edge of the encapsulation cap and connected to the positive and negative electrodes, respectively, to drive the organic light emitting portion, and first and second dummy electrodes formed at one side of the substrate.

To achieve the above and/or other aspects of the present invention, there is provided a substrate of an organic EL device, the substrate comprising a single transparent base panel, organic light emitting portions formed on the base panel at a predetermined interval, encapsulation caps which encapsulate the respective organic light emitting portions, and first groups and second groups of electrodes which drive the respective organic light emitting portions. Each pair of the first group and second group of electrodes includes first and second electrode terminals, respectively, which are drawn out from one or more edges of a corresponding one of the encapsulation caps, and first and second dummy electrodes, respectively, which extend from the first and second electrode terminals to a dead space between the corresponding encapsulation cap and one or more adjacent encapsulation caps, wherein ends of the first and second dummy electrodes are patterned to be connected to one or more adjacent organic light emitting portions so as to inspect the substrate in terms of a unit substrate whether the first and second electrode terminal s are short-circuited or disconnected.

To achieve the above and/or other aspects of the present invention, there is provided another substrate of an organic EL device, the substrate comprising a single transparent base panel, organic light emitting portions formed on the base panel at a predetermined interval, encapsulation caps which encapsulate the respective organic light emitting portions, and first groups and second groups of electrodes which drive the respective organic light emitting portions. Each pair of first group and second group of electrodes includes first and second electrode terminals, respectively, which are drawn out from one or more edges of a corresponding one of the encapsulation caps, and first and second dummy electrodes, respectively, which extend from the first and second electrode terminals to a dead space between the corresponding encapsulation cap and one or more adjacent encapsulation caps.

To achieve the above and/or other aspects of the present invention, there is provided still another substrate of an organic EL device, the substrate comprising a single base panel, organic EL devices formed on the base panel at a predetermined interval so as to be partitioned into two or more areas, and first groups and second groups of electrodes which drive the respective organic EL devices and include first and second electrode terminals which are drawn out from the respective organic EL devices in a matrix type so as to sequentially and electrically connect the first and second groups of electrodes provided at each of the organic EL devices in each area to first groups and second groups of electrodes of adjacent organic EL devices, thereby allowing an inspection by the first and second groups of electrodes of the outermost organic EL devices in each area whether the first and second groups of electrodes are short-circuited or disconnected.

To achieve the above and/or other aspects of the present invention, there is provided yet another substrate, the substrate comprising a single base panel, organic EL devices formed on the base panel at a predetermined interval to form a matrix, groups of electrodes which drive and are drawn out from the respective organic EL devices, groups of lead terminals which are formed between the organic EL devices that are arranged in a line, and connected to corresponding ends of the groups of electrodes so as to have each group of lead terminals be connected to a corresponding group of electrodes, and one or more groups of external terminals which are provided for each area of the matrix, wherein each group of external terminals is electrically connected to the groups of lead terminals in a corresponding area of the matrix, and includes inspecting terminals at ends thereof.

To achieve the above and/or other aspects of the present invention, there is provided a method of cutting a substrate having organic EL devices, the method comprising producing the substrate including forming organic light emitting portions on a single transparent base panel of the substrate at a predetermined interval, fixing encapsulation caps to encapsulate the organic light emitting portions onto the base panel, and patterning first and second groups of electrodes including first and second electrode terminals drawn out from one or more edges of each of the encapsulation caps to drive the organic light emitting portions, and first and second dummy electrodes extending from the first and second electrode terminals into dead space areas between the encapsulation caps and adjacent encapsulation caps, and cutting a portion between each of the encapsulation caps so as to partition the organic EL devices into a plurality of unit organic EL devices.

In the present invention, the first and second electrode terminals of the first and second groups of electrodes can be inspected in terms of a substrate whether they are short-circuited or disconnected. Also, an organic EL device of the present invention has an improved manufacturability because an additional cutting operation to remove a dead space can be avoided.

BRIEF DESCRIPTION OF THE DRAWINGS

These and/or other aspects and advantages of the present invention will become apparent and more readily appreciated from the following description of the embodiments, taken in conjunction with the accompanying drawings of which.

DETAILED DESCRIPTION OF THE PREFERRED EMBODIMENTS

Figure 1:
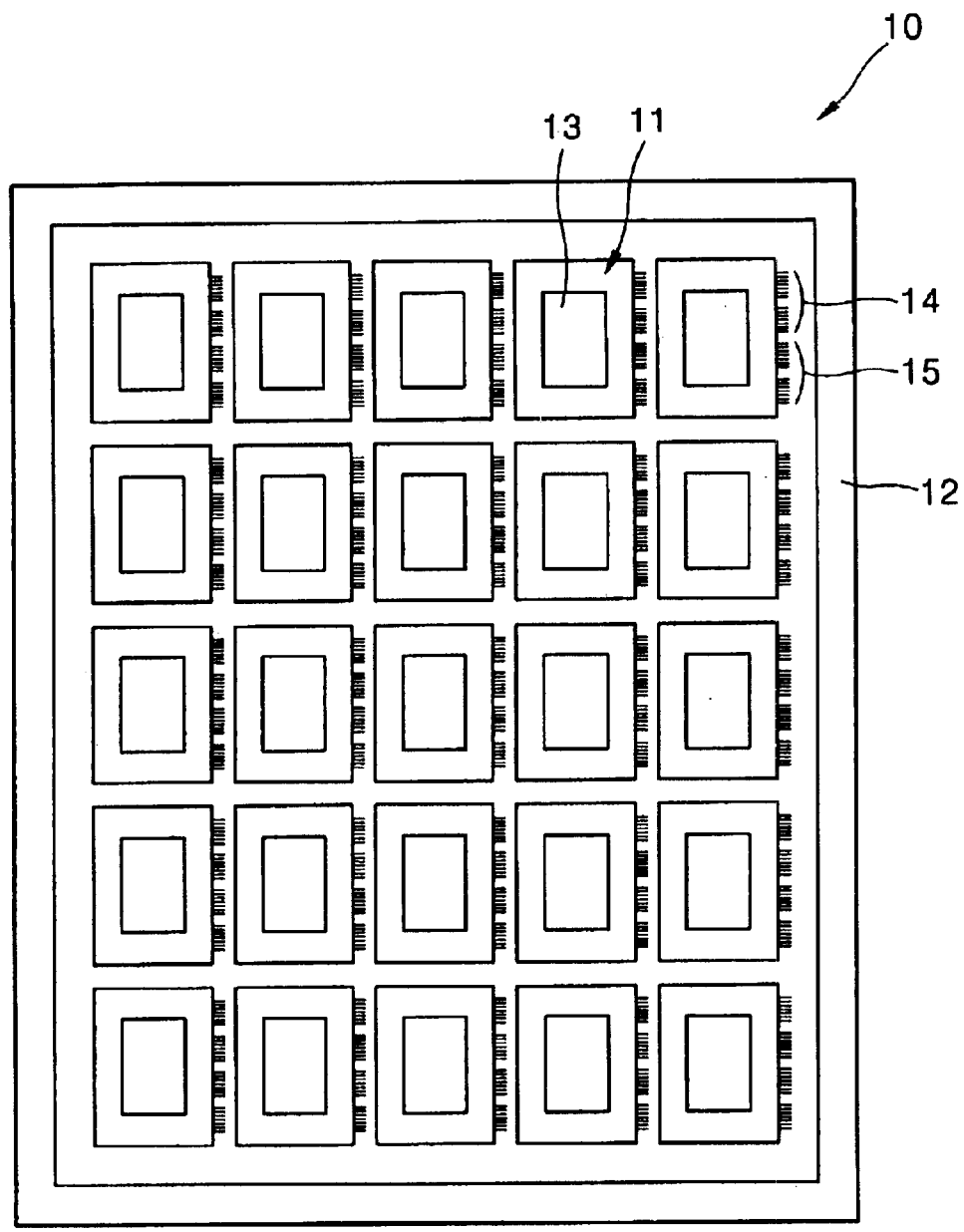
FIG. 1 is a plan view of a substrate of a conventional organic EL device.
Figure 2:
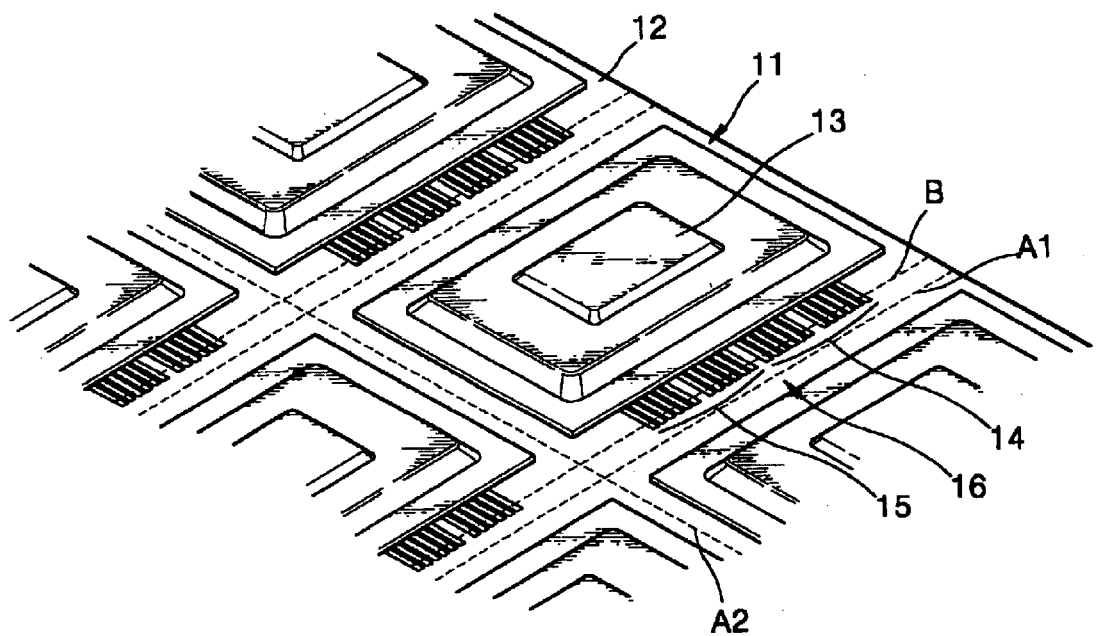
FIG. 2 is a partial perspective view of FIG. 1.

Reference will now be made in detail to the embodiments of the present invention, examples of which are illustrated in the accompanying drawings, wherein like reference numerals refer to the like elements throughout. The embodiments are described below in order to explain the present invention by referring to the figures.

Figure 4A:
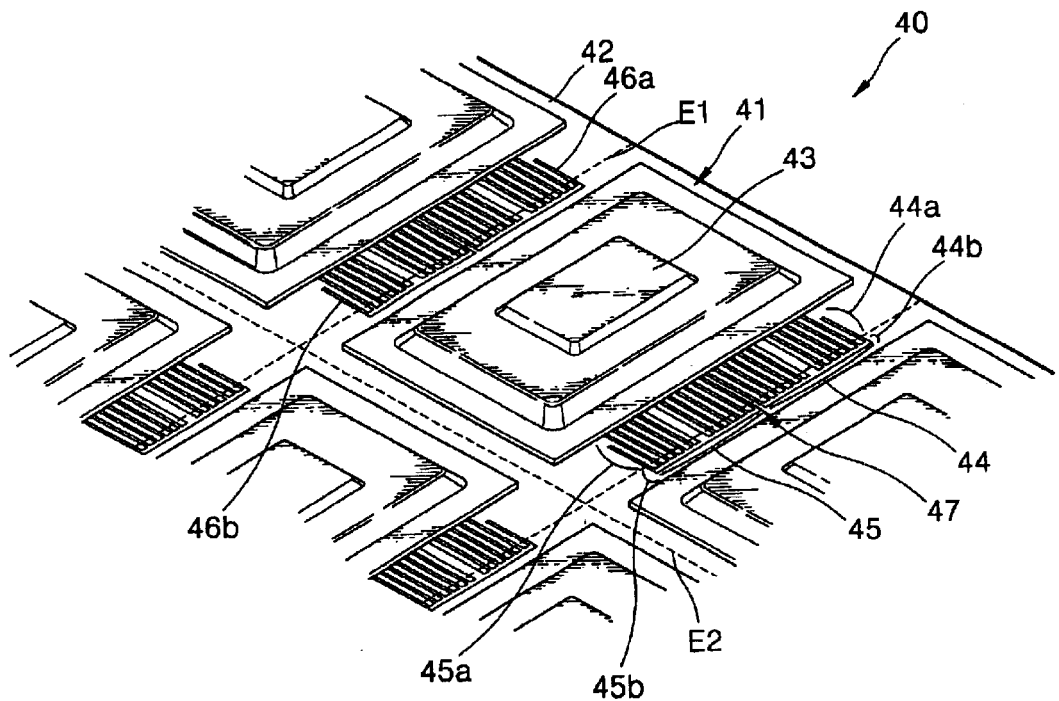
FIG. 4A is a partial perspective view of a substrate of an organic EL device according to an embodiment of the present invention.
Figure 4B:
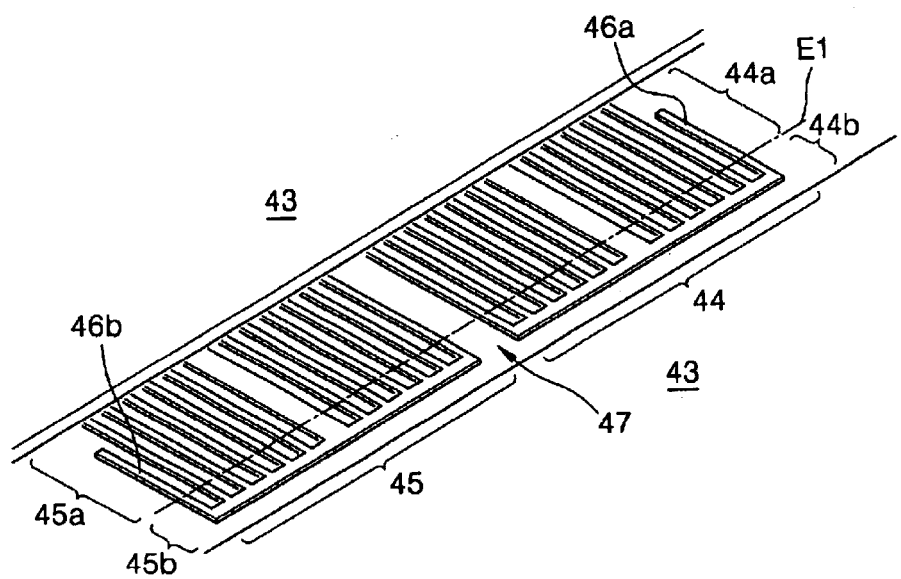
FIG. 4B is a partially magnified view of FIG. 4A.

FIG. 4A shows a partial perspective view of a substrate of an organic EL device according to an embodiment of the present invention. FIG. 4B shows a partially magnified view of FIG. 4A.

Referring to FIG. 4A and FIG. 4B, the substrate 40 has a plurality of unit organic EL devices 41 which are formed on a glass or other transparent base panel 42. The substrate 40 having the organic EL devices 41 is illustrated to show manufacturability by mass production.

The unit organic EL devices 41 include organic light emitting portions (not shown). Each of the organic light emitting portions comprises a positive electrode formed in a predetermined pattern, an organic layer formed on the positive electrode, and a negative electrode having a predetermined pattern in a direction orthogonal with the positive electrode formed on the organic layer. The organic layer includes a hole transport layer, an emitter layer and an electron transport layer, which are sequentially stacked from a top surface of the positive electrode and made of organic compounds.

The organic layer is greatly affected by moisture and oxygen, which deteriorate characteristics of the organic layer and induce a variety of problems. The problems include an exfoliation of a negative electrode and shortened life of the organic layer. To avoid these problems, encapsulation caps 43 are used to encapsulate the respective organic light emitting portions.

First and second groups of electrodes 44 and 45 are drawn out in parallel from one edge of each of the respective encapsulation caps 43 to then be patterned. The first and second groups of electrodes 44 and 45 apply voltages to the positive and negative electrodes, respectively. The first group of electrodes 44 includes first electrode terminals 44a, and first dummy electrodes 44b which extend from the first electrode terminals 44a. A common electrode 46a is formed at an end portion of the first dummy electrodes 44b. The common electrode 46a electrically connects the first dummy electrodes 44b and the first electrode terminals 44a. The second group of electrodes 45 includes second electrode terminals 45a, and second dummy electrodes 45b which extend from the second electrode terminals 45a. A common electrode 46b is also formed at an end portion of the second dummy electrodes 45b. The common electrode 46b electrically connects the second dummy electrodes 45b and the second electrode terminals 45a. By forming the common electrodes 46a and 46b at the first and second groups of electrodes 44 and 45, the first and second electrode terminals 44a and 45a of the first and second groups of electrodes 44 and 45 can be inspected whether they are short-circuited or disconnected, allowing an inspection in terms of a unit substrate. Accordingly, an inspection time can be reduced, thereby improving the inspection efficiency.

The first and second groups of electrodes 44 and 45 are patterned so as to extend toward corresponding edges of encapsulation caps adjacent thereto, that is, into a dead space area 47. Accordingly, a narrow space exists between the ends of the common electrodes 46a and 46b of the first and second dummy electrodes 44b and 45b of the first and second groups of electrodes 44 and 45, and an edge of the adjacent encapsulation cap 43. The first and second groups of electrodes 44 and 45 are not electrically connected with the positive and negative electrodes of the adjacent organic light emitting portions.

After the substrate 40 of the organic EL device having the above-described configuration is inspected by the common electrodes 46a and 46b of the first and second groups of electrodes 44 and 45, the substrate 40 is cut to be partitioned into the respective unit organic EL devices 41 as follows.

Figure 3:
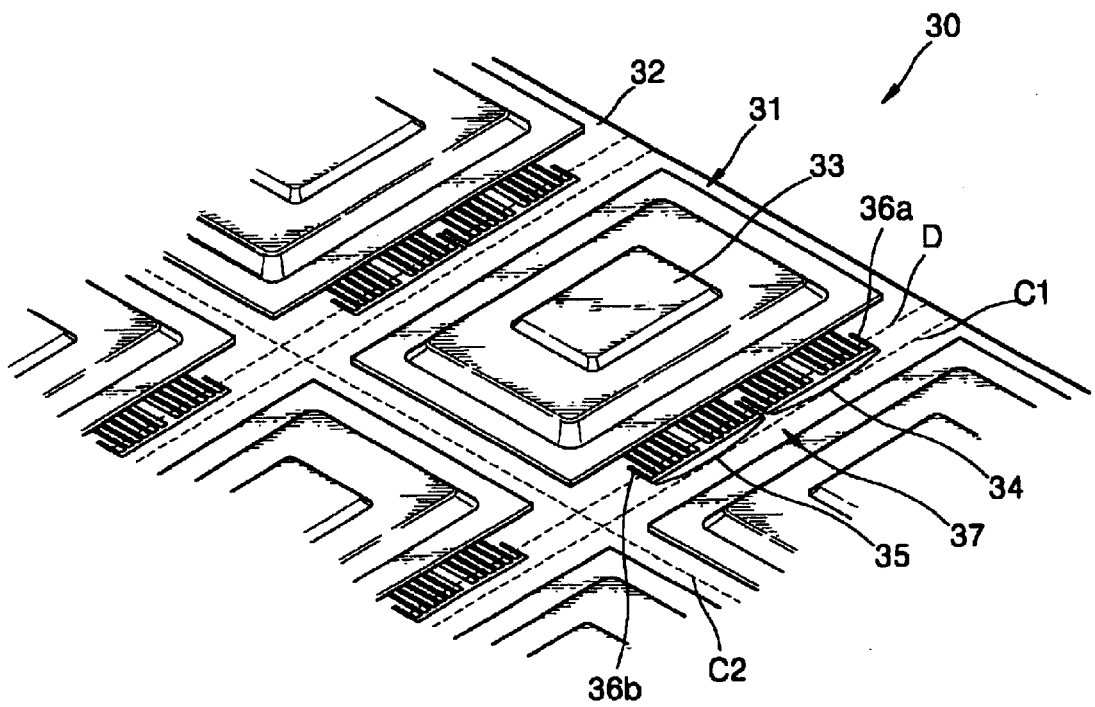
FIG. 3 is a partial perspective view of another substrate of a conventional organic EL device.

The substrate 40 of the organic EL device is cut at portions between the respective encapsulation caps 43. The portions of the substrate 40, where the first and second groups of electrodes 44 and 45 are patterned, are provided between each of the first electrode terminals 44a and the first dummy electrodes 44b, of the first group of electrodes 44, and between each of the second electrode terminals 45a and the second dummy electrodes 45b, of the second group of electrodes 45.

Where the substrate 40 is cut along a cutting line El shown in FIG. 4A, the first and second dummy electrodes 44b and 45b and the common electrodes 46a and 46b can be eliminated by a single cutting operation. Accordingly, unlike the conventional substrate of the organic EL device shown in FIG. 3, in which further cutting operations are performed to eliminate dead space areas, additional cutting operations are not required in the present invention. Accordingly, a manufacturability of the unit organic EL devices 41 is improved.

The cutting of the substrate 40 can be performed by known cutting methods, such as using a glass cutter, and by methods to be known. Cutting the substrate 40 along the cutting lines E1 and E2 produces a plurality of unit organic EL devices 41.

Figure 5:
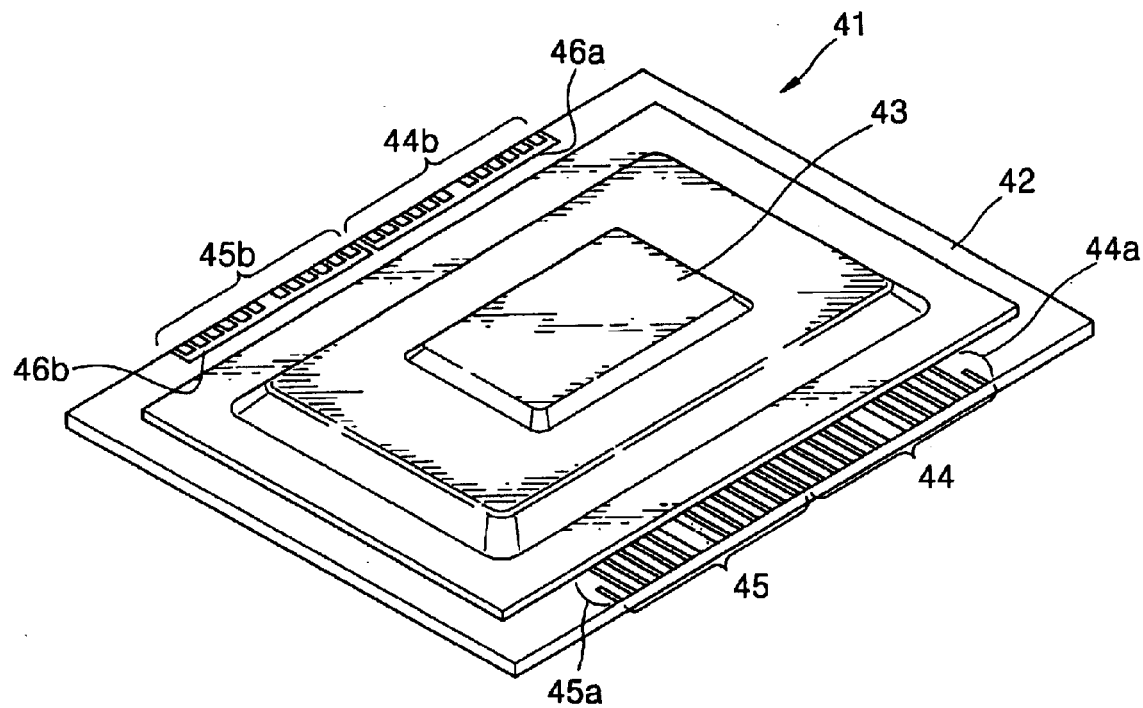
FIG. 5 is a perspective view illustrating a unit organic EL device produced by cutting the substrate in FIG. 4A.

FIG. 5 shows a unit organic EL device 41 cut in the above-described cutting manner. As shown in FIG. 5, each of the unit organic EL devices 41 includes an organic light emitting portion (not shown) and an encapsulation cap 43 which encapsulates the organic light emitting portion. First and second electrode terminals 44a and 45a of the first and second groups of electrodes 44 and 45 are drawn out in parallel from an edge of the encapsulation cap 43 to an edge of a cut panel 42 to then be patterned. First and second dummy electrodes 44b and 45b and common electrodes 46a and 46b (from an adjacent unit organic EL device) are cut and provided at the other edge of the encapsulation cap 43. Whereas the first and second electrode terminals 44a and 45a patterned at an edge of the encapsulation cap 43 are used to drive the organic light emitting portion, the first and second dummy electrodes 44b and 45b provided at the other edge of the encapsulation cap 43 are not used to drive the organic light emitting portion.

Figure 6A:
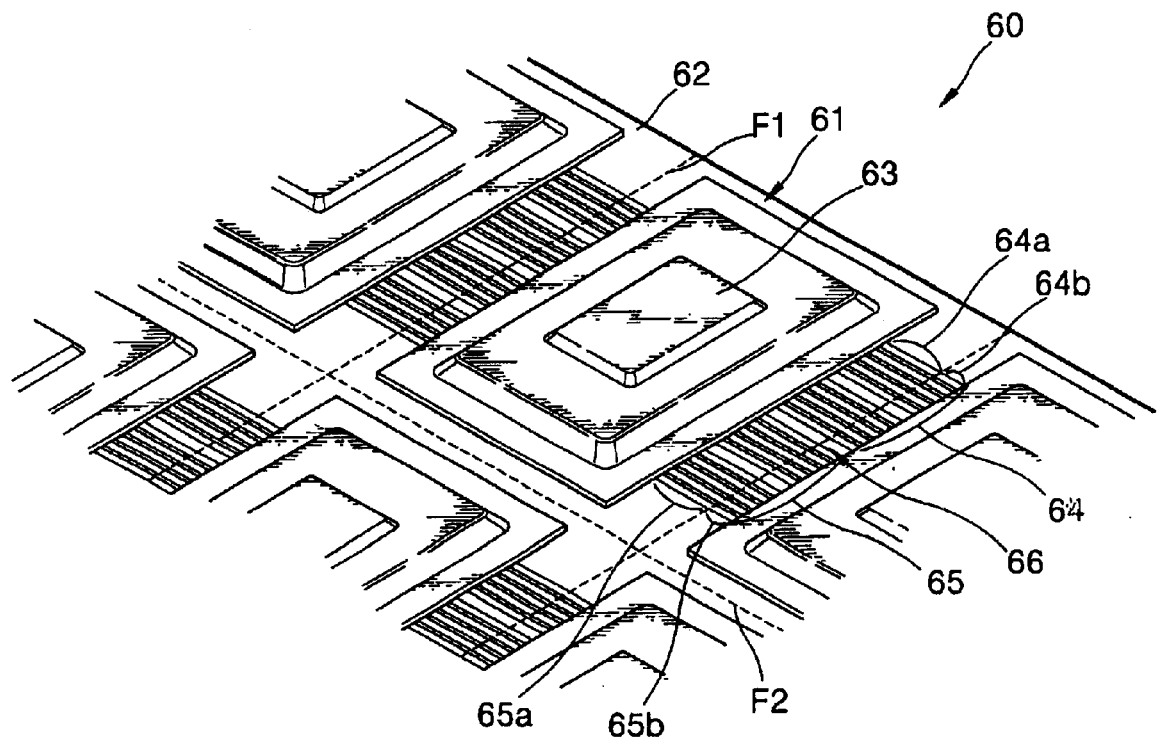
FIG. 6A is a partial perspective view of a substrate of an organic EL device according to another embodiment of the present invention.
Figure 6B:
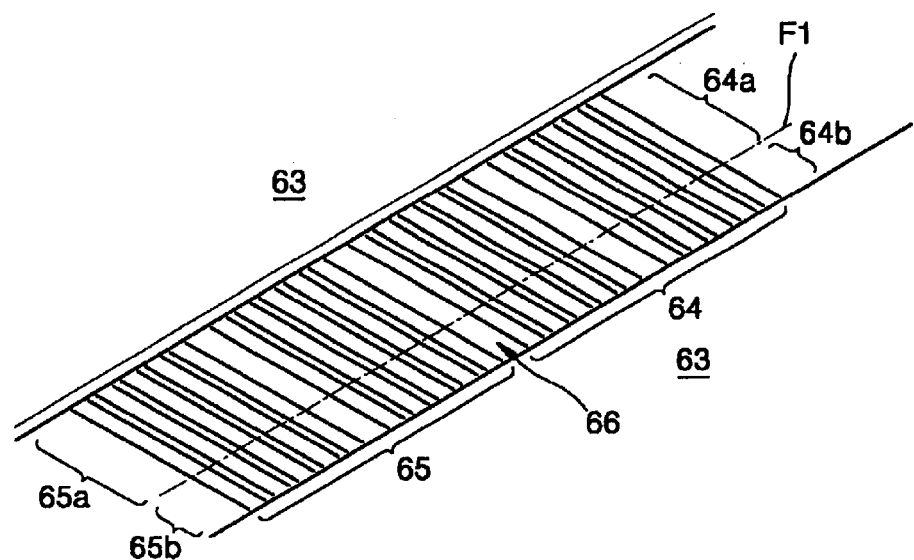
FIG. 6B is a partially magnified view of FIG. 6A.

FIG. 6A shows a partial perspective view of a substrate 60 of an organic EL device according to another embodiment of the present invention. FIG. 6B is a partially magnified view of FIG. 6A.

In the substrate 60 shown in FIG. 6A, a plurality of organic light emitting portions (not shown) are provided on a large base panel 62 at a predetermined interval. First and second groups of electrodes 64 and 65 are drawn out in parallel from one edge of each of the respective organic light emitting portions to then be patterned up to a dead space area 66. The first and second groups of electrodes 64 and 65 apply voltages to the positive and negative electrodes, respectively. In more detail, the first group of electrodes 64 includes first electrode terminals 64a, and first dummy electrodes 64b which extend from the first electrode terminals 64a to then be electrically connected with a positive electrode of an adjacent organic light emitting portion. The second group of electrodes 65 includes second electrode terminals 65a, and second dummy electrodes 65b which extend from the second electrode terminals 65a to then be electrically connected with a negative electrode of the adjacent organic light emitting portion. Thus, as the above-described process is repeated, the organic light emitting portions which are arranged on the base panel 62 in a row, in a direction in which the first and second groups of electrodes 64 and 65 are drawn out, can be sequentially and electrically connected. The electrically connected organic light emitting portions are provided on the base panel 62 in a plurality of rows.

In a state in which the first and second groups of electrodes 64 and 65 are patterned on the organic light emitting portions, the organic light emitting portions are encapsulated by the encapsulation caps 63, thereby completing the substrate 60 with a plurality of unit organic EL devices 61.

In the substrate 60 having the above-described configuration, the organic light emitting portions of each row are all electrically connected. Common electrodes (not shown) may be formed at the first and second dummy electrodes 64b and 65b of the first and second groups of electrodes 64 and 65 provided at the outermost organic light emitting portions. Thus, the organic light emitting portions of the same row can be inspected at once, thereby performing inspection more efficiently. Although an inspection by row is illustrated, it is understood that an inspection can be performed in terms of each group of electrodes constituting first or second dummy electrodes.

After the inspecting of the substrate 60, the substrate 60 is cut to be partitioned into the respective unit organic EL devices 61.

A cutting method of the substrate 60 will now be described. Cutting portions of the substrate 60 are portions between the encapsulation caps 63, that is, between each of the first electrode terminals 64a and the first dummy electrodes 64b, of the first group of electrodes 64, and between each of the second electrode terminals 65a and the second dummy electrodes 65b, of the second group of electrodes 65. Where the substrate 60 is cut along a cutting line F1 shown in FIG. 6A, the first and second electrode terminals 64a and 65a are provided at one edge of the encapsulation cap 63 to then be used to apply voltages to positive and negative electrodes of the respective organic light emitting portion to drive the organic light emitting portion. However, the first and second dummy electrodes 64b and 65b, which are separated from the first and second electrode terminals 64a and 65a, are provided at the other edge of the adjacent encapsulation cap 63. The first and second dummy electrodes 64b and 65b provided at the other edge of the adjacent encapsulation cap 63 are not used to apply voltages to positive and negative electrodes of the adjacent organic light emitting portion to drive the adjacent organic light emitting portion.

Cutting the substrate 60 once along the cutting line F1 partitions a row of unit organic EL devices 61 and removes the dead space area 66. Cutting the substrate 60 along the cutting lines F1 and F2 produces a plurality of unit organic EL devices 61.

Figure 7:
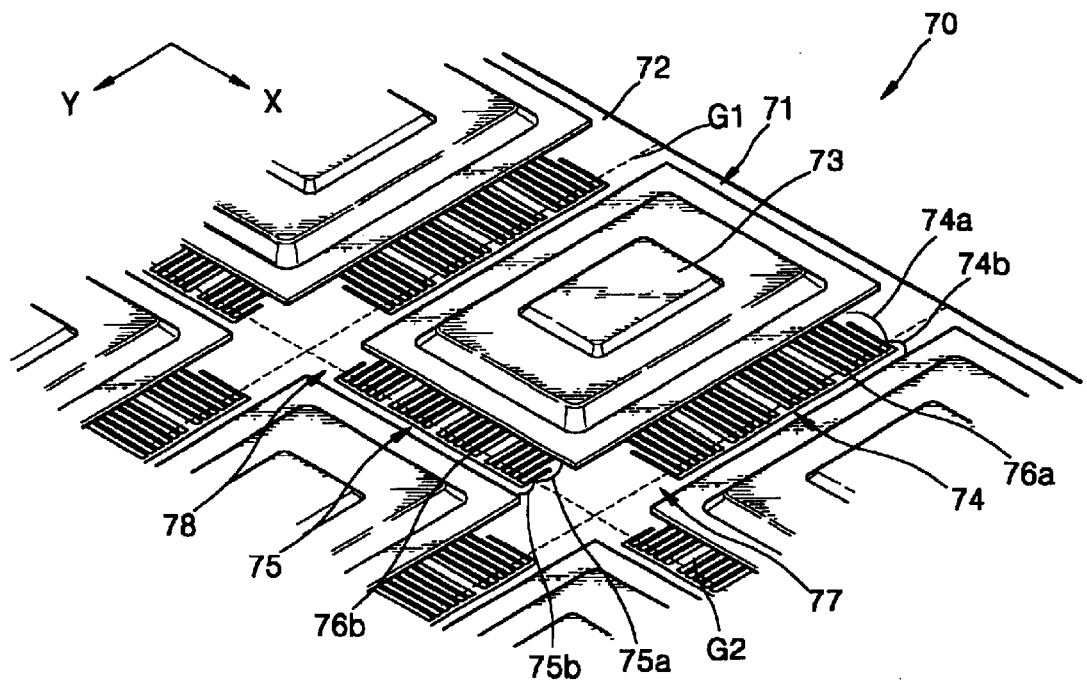
FIG. 7 is a partial perspective view of a substrate of an organic EL device according to yet another embodiment of the present invention.

FIG. 7 shows a partial perspective view of a substrate 70 of an organic EL device according to yet another embodiment of the present invention.

In the substrate 70 shown in FIG. 7, a plurality of organic light emitting portions (not shown) are provided on a large base panel 72 at a predetermined interval. Encapsulation caps 73 are provided to encapsulate the respective organic light emitting portions. A first group of electrodes 74 are drawn out from one of four edges of each of the encapsulation caps 73 in an X direction to then be patterned. A second group of electrodes 75 are drawn out from an edge adjacent to the edge from which the first group of electrodes 74 are drawn out in a Y direction to then be patterned. The first and second groups of electrodes 74 and 75 are electrically connected to positive and negative electrodes of the organic light emitting portions to apply voltages thereto, respectively.

The first and second groups of electrodes 74 and 75 include first and second electrode terminals 74a and 75a, and first and second dummy electrodes 74b and 75b which extend from the first and second electrode terminals 74a and 75a, respectively. Similar to the embodiment shown in FIGS. 4A-5, common electrodes 76a and 76b are formed at ends of the first and second dummy electrodes 74b and 75b. The first and second electrodes 74a and 75a and the first and second dummy electrodes 74b and 75b are all electrically connected by the common electrodes 76a and 76b. By providing the common electrodes 76a and 76b at the first and second groups of electrodes 74 and 75, the first and second electrode terminals 74a and 75a of the first and second groups of electrodes 74 and 75 can be inspected in terms of a substrate whether they are short-circuited or disconnected.

The first and second dummy electrodes 74b and 75b of the first and second groups of electrodes 74 and 75 are patterned so as to extend toward respective edges of encapsulation caps 73 adjacent thereto in X and Y directions, that is, into dead space areas 77 and 78. Accordingly, narrow spaces exist between the ends of the common electrodes 76a and 76b and edges of the adjacent encapsulation caps 73. The first and second groups of electrodes 74 and 75 are not electrically connected with positive and negative electrodes of the adjacent organic light emitting portions.

After the substrate 70 having the above-described configuration is inspected by the common electrodes 76a and 76b of the first and second groups of electrodes 74 and 75, the substrate 70 is cut to be partitioned into the respective unit organic EL devices 71 as follows.

The substrate 70 having unit the organic EL devices 71 is cut at portions where the first and second groups of electrodes 74 and 75 are patterned. That is, cutting portions of the substrate 70 are provided between each of the first electrode terminals 74a and the first dummy electrodes 74b, of the first group of electrodes 74, and between each of the second electrode terminals 75a and the second dummy electrodes 75b, of the second group of electrodes 75.

Where the substrate 70 is cut along cutting lines G1 and G2 shown in FIG. 7, the first and second dummy electrodes 74b and 75b and the common electrodes 76a and 76b can be eliminated by a single cutting operation. Accordingly, the electrically connected states of the common electrodes 76a and 76b can be eliminated and the dead space areas 77 and 78 can be removed at the same time.

Figure 8:
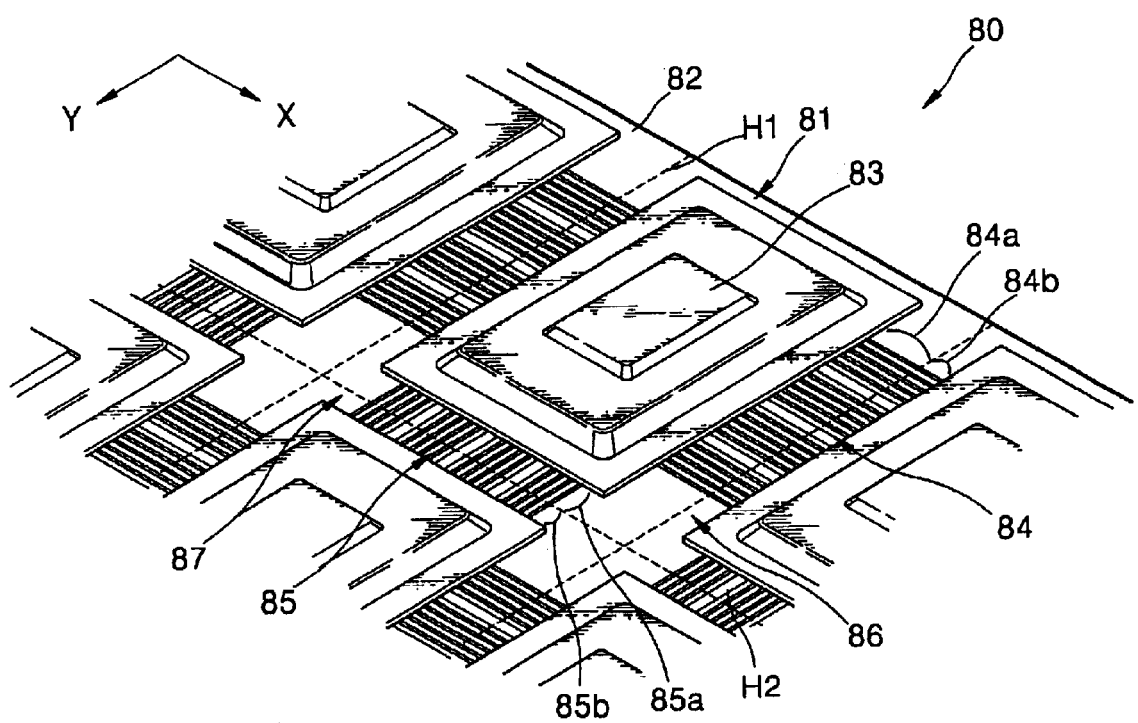
FIG. 8 is a partial perspective view of a substrate of an organic EL device according to still another embodiment of the present invention.

FIG. 8 shows a partial perspective view of a substrate 80 of an organic EL device according to still another embodiment of the present invention.

In the substrate 80 shown in FIG. 8, a plurality of organic light emitting portions (not shown) are provided on a single large base panel 82 at a predetermined interval. A first group of electrodes 84 are drawn out from one of four edges of each of the organic light emitting portions in an X direction to then be patterned up to a dead space area 86. A second group of electrodes 85 are drawn out from an edge adjacent to the edge, from which the first group of electrodes 84 are drawn out, in a Y direction to then be patterned up to a dead space area 87. The first and second groups of electrodes 84 and 85 include first and second electrode terminals 84a and 85a, first dummy electrodes 84b which extend from the first electrode terminals 84a to be electrically connected with a positive electrode of an adjacent organic light emitting portion in the X direction, and second dummy electrodes 85b which extend from the second electrode terminals 85a to be electrically connected with a negative electrode of an adjacent organic light emitting portion in the Y direction. Thus, the organic light emitting portions that are arranged on the base panel 82 in a column, in a direction in which the first group of electrodes 84 are drawn out, that is, in the X direction, can be sequentially and electrically connected. Furthermore, the organic light emitting portions, which are all electrically connected, are provided on the base panel 82 in a row in a direction in which the second group of electrodes 85 are drawn out, that is, in the Y direction.

In a state in which the first and second groups of electrodes 84 and 85 are patterned on the organic light emitting portions, the organic light emitting portions are encapsulated by the encapsulation caps 83, thereby completing the substrate 80 with a plurality of unit organic EL devices 81.

In the substrate 80 having the above-described configuration, the organic light emitting portions of the same column or row are all electrically connected. Common electrodes (not shown) may be formed at the first and second dummy electrodes 84b and 85b of the first and second groups of electrodes 84 and 85 provided at the outermost organic light emitting portions. Thus, the organic light emitting portions of the same column or row can be inspected at once, thereby efficiently performing an inspection, which will be further described in detail with reference to FIGS. 9 through 10B.

After inspecting the substrate 80, the substrate 80 is cut to be partitioned into the respective unit organic EL devices 81. Cutting portions of the substrate 80 are portions between the encapsulation caps 83, that is, between each of the first electrode terminals 84a and the first dummy electrodes 84b, of the first group of electrodes 84, and between each of the second electrode terminals 85a and the second dummy electrodes 85b, of the second group of electrodes 85. Where the substrate 80 having the unit organic EL devices 81 is cut along cutting lines H1 and H2 shown in FIG. 8, the unit organic EL devices 81 can be partitioned and the dead space areas 86 and 87 can be removed by a single cutting operation. Therefore, unlike the conventional substrate of the organic EL device, in which further cutting operations are necessarily performed to eliminate dead space areas, additional cutting operations are not required by the substrate 80 of the organic EL device of the present invention. Accordingly, a manufacturability of the unit organic El devices 81 is improved.

Figure 9:
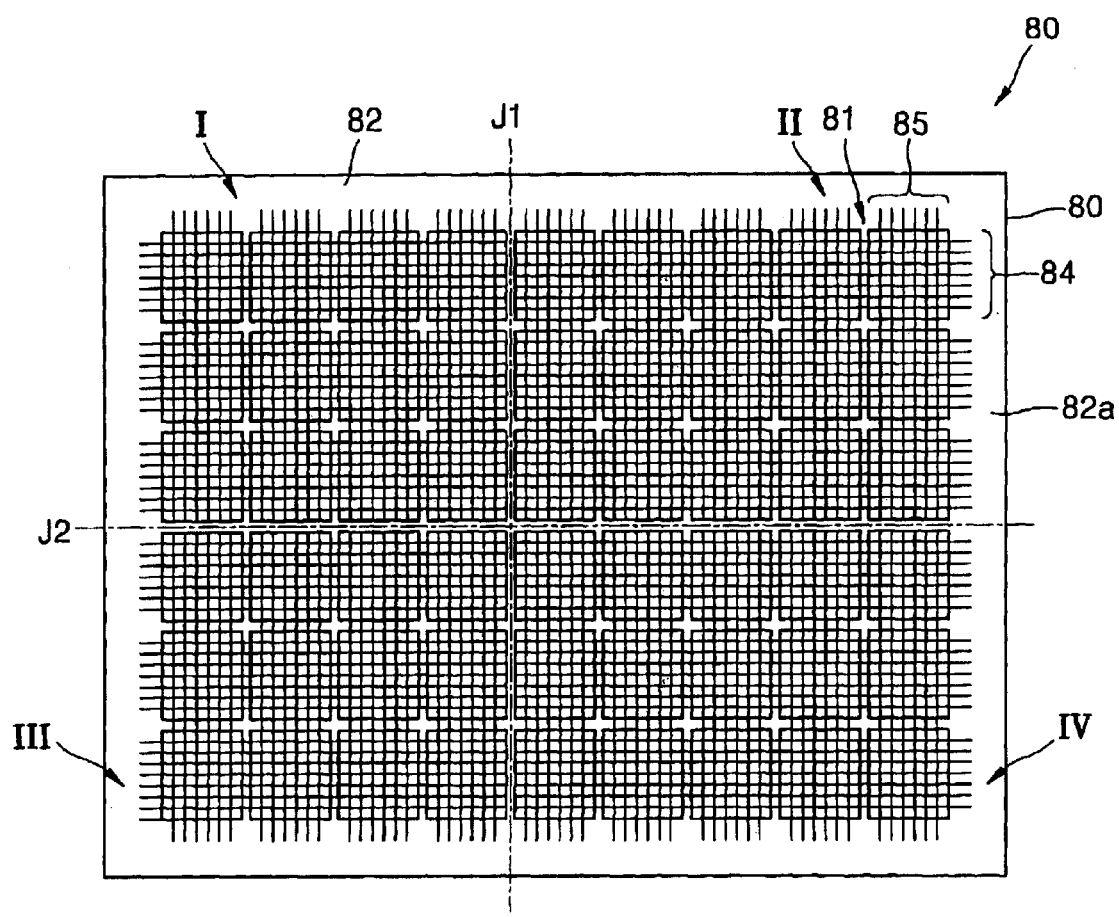
FIG. 9 is a plan view of the entire substrate of the organic EL device shown in FIG. 8.

FIG. 9 illustrates an exemplary inspection method of an overall substrate of the organic EL device shown in FIG. 8, wherein like reference numerals refer to the like elements throughout.

In the substrate 80 shown in FIG. 9, a plurality of organic EL devices 81 are provided on a large single base panel 82 at a predetermined interval in a matrix type manner. A first group of electrodes 84 are drawn out from each of the organic EL devices 81 in a row direction, and a second group of electrodes 85 are drawn out in a column direction so as to be orthogonal to the first group of electrodes 84. The organic EL devices 81 are partitioned into four areas, I, III and IV along lines J1 and J2.

In each of the respective partitioned areas I, II, III and IV, the respective ends of the first group of electrodes 84 drawn out from each of the organic EL devices 81 are electrically connected to the first group of electrodes 84 provided at opposite adjacent organic EL devices 81. Likewise, the respective ends of the second group of electrodes 85 drawn out from each of the organic EL devices 81 are electrically connected to the second group of electrodes 85 provided at opposite adjacent organic EL devices 81. In such a manner, the organic EL devices 81 arranged on the base panel 82 in a row direction are sequentially and electrically connected along a lead direction of the first group of electrodes 84. Also, the organic EL devices 81 arranged on the base panel 82 in a column direction are sequentially and electrically connected along a lead direction of the second group of electrodes 85. The organic EL devices positioned at opposite sides with respect to the J1 and J2 lines by which the respective areas I, II, III and IV are partitioned, are not electrically connected to each other by the first and second groups of electrodes 84 and 85.

In the respective areas I, II, III and IV, the first and second groups of electrodes 84 and 85 are drawn out from the outermost organic EL devices 81 at the periphery 82a of the base panel 82.

As described above, the organic EL devices 81 of the same column or row in each of the respective areas I, II, III and IV can be inspected at once by the first and second groups of electrodes 84 and 85 positioned at the periphery 82a of the base panel 82.

Although the substrate 80 partitioned into four areas is illustrated above, it is understood that a partitioning into two or more areas, other than the four areas, may be performed. That is, the organic EL devices 81 according to the present invention can be partitioned into two or more areas, and multiple organic EL devices in each partitioned area can be inspected at once.

In the plurality of organic EL devices 81 provided on the large single base panel 82, where the first and second groups of electrodes 84 and 85 are sequentially and electrically connected to those in adjacent organic EL devices along each column and row, the entire length of the first and second groups of electrodes 84 and 85 are considerable. In such a case, a line resistance may increase or a disconnection may occur to the first and second groups of electrodes 84 and 85, making an accurate inspection thereof impossible. Therefore, according to the present invention, an accurate inspection can be performed by partitioning the substrate 80 of the organic EL device into two or more areas.

Figure 10A:
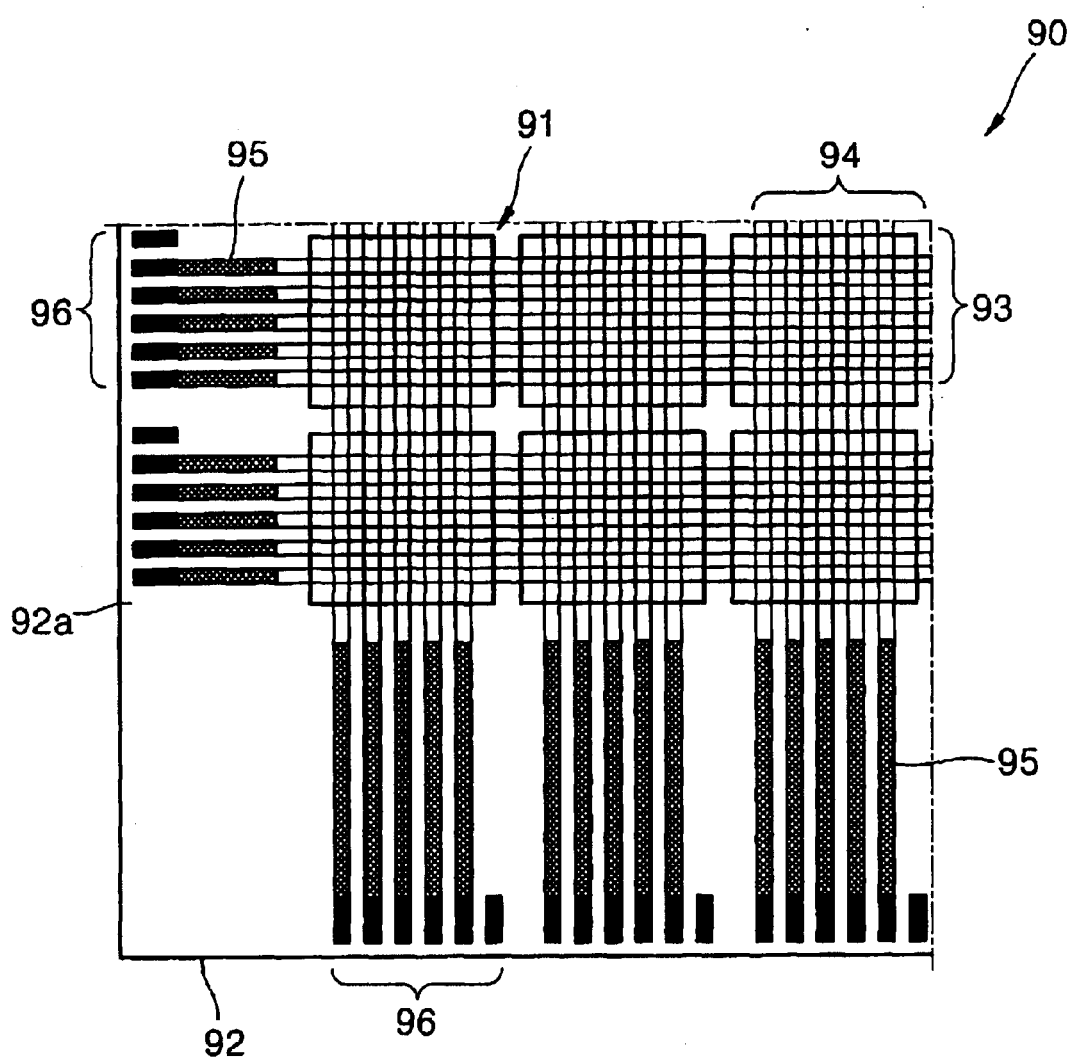
FIGS. 10A and 10B are partial plan views of substrates of an organic EL device with different product standards.
Figure 10B:
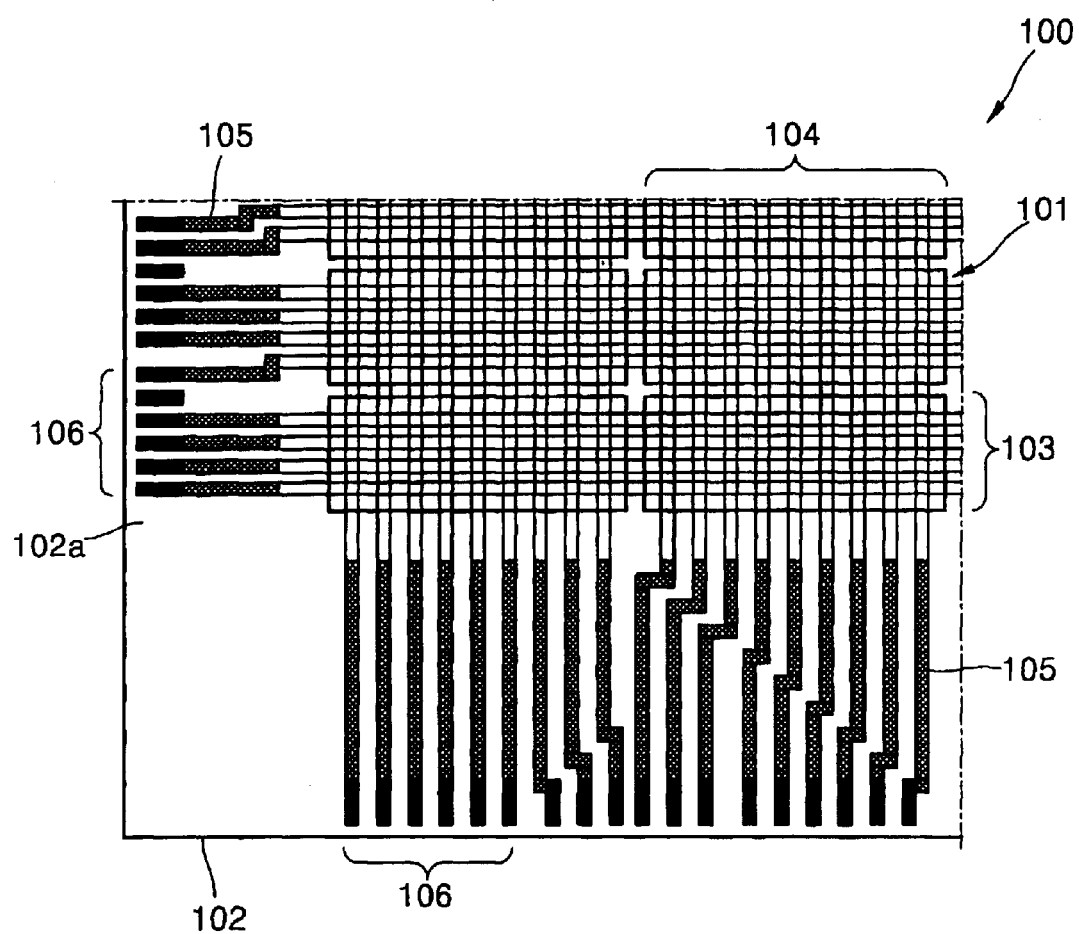

FIGS. 10A and 10B show partial plan views of substrates of an organic EL device with different product standards. In a substrate 90 shown in FIG. 10A, a plurality of organic EL devices 91 are provided on a large single base panel 92 at a predetermined interval in a matrix type manner. First and second groups of electrodes 93 and 94 are drawn out from outermost organic EL devices on the base panel 92 to the periphery 92a of the base panel 92. Ends of the first and second groups of electrodes 93 and 94 drawn out in the above-described manner are connected to inspection terminals 96 provided at the periphery 92a of the base panel 92 via extending parts 95.

The inspection terminals 96 are formed at predetermined pitches, and the respective organic EL devices 91 provided on the base panel 92 in a matrix type manner are simultaneously inspected by inspecting the inspection terminals 96.

Referring to FIG. 10B, similar to the substrate 90 shown in FIG. 10A, in a substrate 100, a plurality of organic EL devices 101 are provided on a large single base panel 102 at a predetermined interval in a matrix type manner. First and second groups of electrodes 103 and 104 are drawn out from outermost organic EL devices on the base panel 102 to the periphery 102a of the base panel 102. Ends of the first and second groups of electrodes 103 and 103 drawn out in the above-described manner are connected to inspection terminals 106 provided at the periphery 102a of the base panel 102 via extending parts 105.

According to an aspect of the present invention, although the organic devices 101 have a different dimension (product standard) as compared to the devices 91 of FIG. 10A, the inspection terminals 106 are formed at the same pitch as the inspection terminals 96 provided on the substrate 90 shown in FIG. 10A. Accordingly, the extending parts 105 are formed from the ends of the first and second groups of electrodes 103 and 104 to the inspection terminals 106 in a predetermined pattern.

As described above, since the pitches and locations of the inspection terminals 96 and 106 are made the same irrespective of the product standards of the respective organic EL devices 91 and 101, it is not necessary to replace the inspection devices according to the product standards, thereby reducing the inspection cost.

Figure 11:
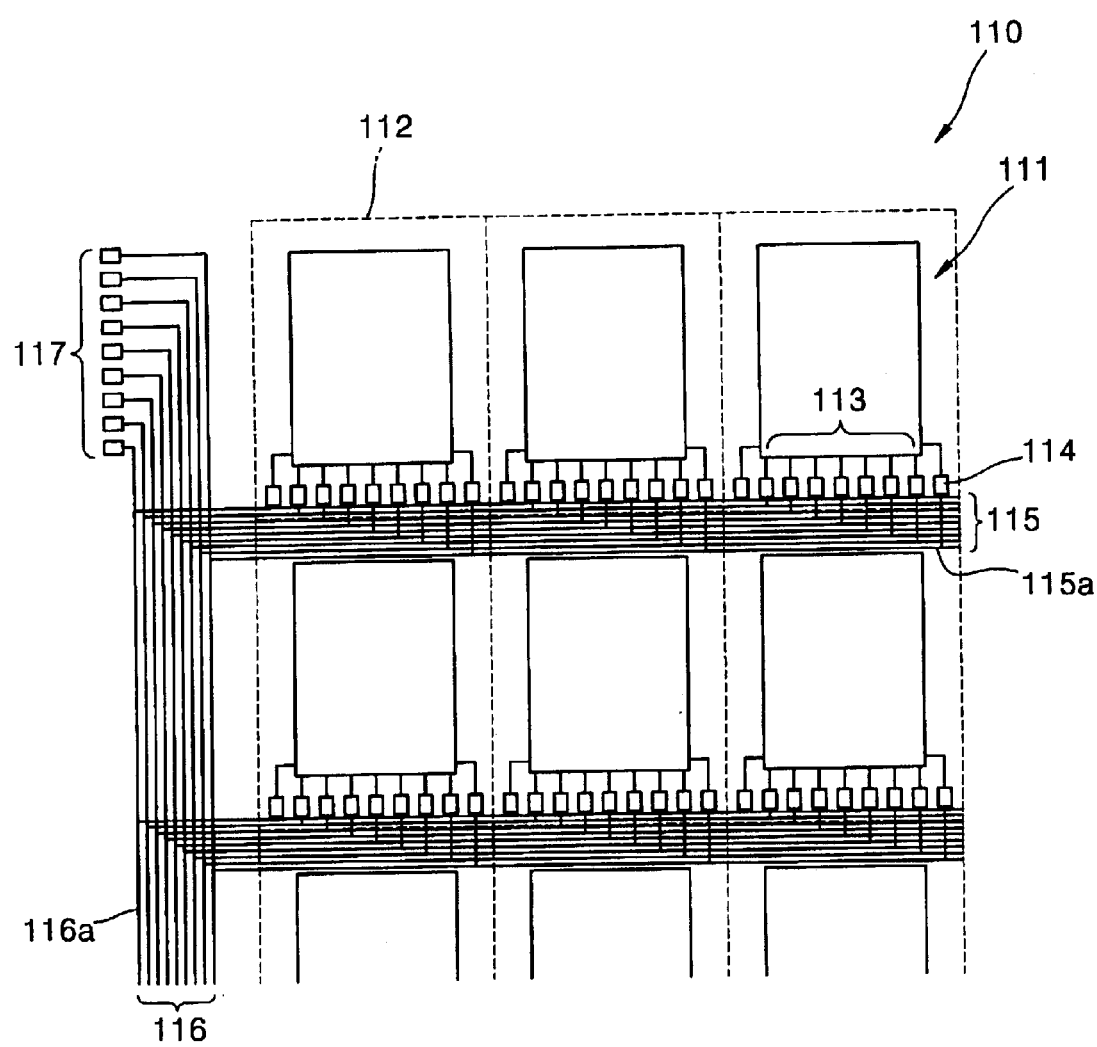
FIG. 11 is a partial plan view of a substrate of an organic EL device according to still yet another embodiment of the present invention.

FIG. 11 shows a partial plan view of a substrate 110 of an organic EL device according to still yet another embodiment of the present invention.

The substrate 110 shown in FIG. 11 includes a plurality of organic EL devices 111 formed on a single base panel 112 in a matrix type manner. Here, the organic EL devices 111 are, for example, an active matrix drive type. A group of electrodes 113 are drawn out from each of the organic EL devices 111. In other words, the group of electrodes 113 are formed in the same pattern at the same location in view of one side of each organic EL device 111. Connection parts 114 are formed at the respective ends drawn out from the group of electrodes 113.

Groups of lead terminals 115 are continuously formed between each of the respective organic EL devices 11. That is, groups of lead terminals 115 are provided between a group of organic EL devices 111 arranged in a line and another group of organic EL devices 11 arranged in another adjacent line.

Each group of lead terminals 115 includes a plurality of lead wires 115a. In each organic EL device 111, the number of the lead wires 115a is the same as that of the connection parts 114 of the group of electrodes 113. Thus, the lead wires 115a are connected to the connection parts 114 one by one, respectively.

Ends of the provided groups of lead terminals 115 are connected to groups of external terminals 116 (FIG. 11 illustrates a group of external terminals 116 for a partitioned area of the substrate 110). Each group of external terminals 116 includes a plurality of terminal wires 116a. The number of the terminal wires 116a is the same as that of the lead wires 115a of the group of lead terminals 115. Thus, the terminal wires 116a are connected to the lead wires 115a one by one, respectively. The groups of lead terminals 115 are all electrically connected to the groups of external terminals 116.

An inspection terminal 117 is formed at each terminal wire 116a of each group of external terminals 116, thereby allowing an inspection of whether the groups of electrodes 113 are short-circuited or disconnected. Additionally, the inspection can be performed by connecting an external scanner (not shown) through the inspecting terminal 117. In this case, an operation state of an organic EL device can be checked.

Since the substrate 110 having the unit organic EL devices 111 is constructed as described above, inspection can be performed in terms of a unit substrate, thereby improving the inspection efficiency. After inspecting the substrate 110, the substrate 110 is cut to be partitioned into the respective unit organic EL devices 111.

As described above, according to the present invention, first and second electrode terminals of first and second groups of electrodes can be inspected in terms of a substrate whether they are short-circuited or disconnected. Also, an additional cutting operation to remove a dead space, where patterns of the first and second groups of electrodes are formed, can be avoided, thereby improving the mass manufacturability of an organic EL device.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. An organic electroluminescent display (EL) device comprising:
   a substrate;
   an organic light emitting portion which includes:
      a positive electrode formed in a predetermined pattern,
      an organic layer formed on the positive electrode, and
      a negative electrode having a predetermined pattern in a direction orthogonal with the positive electrode;
   an encapsulation cap which encapsulates the organic light emitting portion;
   first and second groups of electrodes which are drawn out from at least one edge of the encapsulation cap and connected to the positive and negative electrodes, respectively, to drive the organic light emitting portion; and
   first and second dummy electrodes formed at one side of the substrate.

2. A substrate of an organic EL device, comprising:
   a single transparent base panel;
   organic light emitting portions formed on the base panel at a predetermined interval;
   encapsulation caps which encapsulate the respective organic light emitting portions; and
   first groups and second groups of electrodes which drive the respective organic light emitting portions, wherein each pair of first group and second group of electrodes includes:
      first and second electrode terminals, respectively, which are drawn out from one or more edges of a corresponding one of the encapsulation caps, and first and second dummy electrodes, respectively, which extend from the first and second electrode terminals to a dead space between the corresponding encapsulation cap and one or more adjacent encapsulation caps, wherein ends of the first and second dummy electrodes are patterned to be connected to one or more adjacent organic light emitting portions so as to inspect the substrate in terms of a unit substrate whether the first and second electrode terminal s are short-circuited or disconnected.

3. The substrate according to claim 2, wherein the first group and second group of electrodes are drawn out from one edge of the corresponding encapsulation cap to electrically connect all the organic light emitting portions arranged in a line.

4. The substrate according to claim 2, wherein the first group of electrodes are drawn out from at least one among four edges of the corresponding encapsulation cap and the second group of electrodes are drawn from another edge adjacent to the one edge of the corresponding encapsulation cap so as to electrically connect the organic light emitting portions arranged along the same row and column.

5. The substrate according to claim 3, further comprising common electrodes which are formed at end portions of the first and second dummy electrodes of the outermost organic light emitting portions on the base panel.

6. The substrate according to claim 4, further comprising common electrodes which are formed at end portions of the first and second dummy electrodes of the outermost organic light emitting portions on the base panel.

7. A substrate of an organic EL device comprising:
a single transparent base panel;
organic light emitting portions formed on the base panel at a predetermined interval;
encapsulation caps which encapsulate the respective organic light emitting portions; and
first groups and second groups of electrodes which drive the respective organic light emitting portions, wherein each pair of first group and second group of electrodes includes:
first and second electrode terminals, respectively, which are drawn out from one or more edges of a corresponding one of the encapsulation caps, and
first and second dummy electrodes, respectively, which extend from the first and second electrode terminals to a dead space between the corresponding encapsulation cap and one or more adjacent encapsulation caps.

8. The substrate according to claim 7, wherein the first group and second group of electrodes are drawn out from at least one edge of the corresponding encapsulation cap in parallel.

9. The substrate according to claim 7, wherein the first group of electrodes are drawn out from at least one among four edges of the corresponding encapsulation cap and the second group of electrodes are drawn from another edge adjacent to the one edge of the corresponding encapsulation cap from which the first group of electrodes are drawn out.

10. The substrate according to claim 7, further comprising common electrodes which are formed at end portions of the first and second dummy electrodes so as to inspect the substrate in terms of a unit substrate whether the first and second electrode terminals are short-circuited or disconnected.

11. The substrate according to claim 8, further comprising common electrodes which are formed at end portions of the first and second dummy electrodes so as to inspect the substrate in terms of a unit substrate whether the first and second electrode terminals are short-circuited or disconnected.

12. The substrate according to claim 9, further comprising common electrodes which are formed at end portions of the first and second dummy electrodes so as to inspect the substrate in terms of a unit substrate whether the first and second electrode terminals are short-circuited or disconnected.

13. A substrate of an organic EL device comprising:
a single base panel;
organic EL devices formed on the base panel at a predetermined interval so as to be partitioned into two or more areas; and
first groups and second groups of electrodes which drive the respective organic EL devices and include first and second electrode terminals which are drawn out from the respective organic EL devices in a matrix type so as to sequentially and electrically connect the first group and second group of electrodes provided at each of the organic EL devices in each area to first groups and second groups of electrodes of adjacent organic EL devices, thereby allowing an inspection by the first and second groups of electrodes of the outermost organic EL devices in each area whether the first and second groups of electrodes are short-circuited or disconnected.

14. The substrate according to claim 13, further comprising inspecting terminals which are provided at a periphery of the base panel and connected to the first and second groups of electrodes drawn out from the outermost organic EL devices on the base panel.

15. The substrate according to claim 14, wherein the inspecting terminals are formed at the same pitch irrespective of a product standard of the organic EL device.

16. A substrate comprising:
a single base panel;
organic EL devices formed on the base panel at a predetermined interval to form a matrix;
groups of electrodes which drive and are drawn out from the respective organic EL devices;
groups of lead terminals which are formed between the organic EL devices that are arranged in a line, and connected to corresponding ends of the groups of electrodes so as to have each group of lead terminals be connected to a corresponding group of electrodes; and
one or more groups of external terminals which are provided for each area of the matrix, wherein each group of external terminals is electrically connected to the groups of lead terminals in a corresponding area of the matrix, and includes inspecting terminals at ends thereof.

17. The organic EL device according to claim 1, wherein the first and second dummy electrodes are separated from first and second groups of electrodes of an adjacent organic EL device with one cutting operation.

18. The substrate according to claim 2, further comprising a single cutting portion which is provided between each of the encapsulation caps so as to separate the first and second dummy electrodes from the one or more adjacent organic light emitting portions, and individualize organic El devices of the substrate into a plurality of unit organic El devices.

19. The substrate according to claim 7, further comprising a single cutting portion which is provided between each of the encapsulation caps so as to remove the first and second dummy electrodes and the dead space between the encapsulation caps.

* * * * *